United States Patent [19]

Miida et al.

[11] Patent Number: 4,462,089
[45] Date of Patent: Jul. 24, 1984

[54] NONVOLATILE SEMICONDUCTOR MEMORY DEVICE

[75] Inventors: Takashi Miida, Tokyo; Yoshihiko Hika; Akira Takei, both of Yokohama, all of Japan

[73] Assignee: Fujitsu Limited, Kawasaki, Japan

[21] Appl. No.: 331,286

[22] Filed: Dec. 16, 1981

[30] Foreign Application Priority Data

Dec. 29, 1980 [JP] Japan ............................. 55/185336

[51] Int. Cl.³ .............................................. G11C 11/40
[52] U.S. Cl. ................................... 365/185; 365/218; 357/23
[58] Field of Search ............... 365/185, 218; 357/23, 357/32, 45

[56] References Cited

U.S. PATENT DOCUMENTS 4,099,196 7/1978 Simko .................................. 365/185

Primary Examiner—Terrell W. Fears
Attorney, Agent, or Firm—Staas & Halsey

[57] ABSTRACT

A nonvolatile semiconductor memory device of a floating-gate type comprises a floating-gate and two control gates. The floating-gate is divided into two conductive regions having a conductivity type opposite to each other. A first control gate is placed above a first region and a second control gate is placed above a second region. In this device, the erase operation is performed by causing avalanche breakdown within the floating-gate.

13 Claims, 12 Drawing Figures

NONVOLATILE SEMICONDUCTOR MEMORY DEVICE

BACKGROUND OF THE INVENTION

The present invention relates to a nonvolatile semiconductor memory device and, more particularly, to a nonvolatile semiconductor memory device of a floating-gate type.

In general, a floating-gate type nonvolatile semiconductor memory device comprises two gates: a floating-gate and a control gate. In an N-channel device, for example, accumulation of electrons in the floating-gate results in a high threshold value, while expulsion of electrons from the floating-gate results in a low threshold value. Such two states correspond to the information "1" and "0". Most of the floating-gate type devices use the tunnel effect for both the write and erase operations. Even a FAMOS (Floating-Gate Avalanche-Injection MOS) device, which is a kind of floating-gate type device, uses the tunnel effect for the erase operation. In this case, however, the insulating layer, such as silicon dioxide ($SiO_2$), built between the floating-gate and the control gate would have to be thin enough to allow carriers to a tunnel through. For example, the thickness of the insulating layer of $SiO_2$ would have to be about 30 Å, which is difficult to manufacture. The insulating layer can be thick, but this would necessitate the application of a high voltage to the control gate, which would result in electrostatic destruction of the insulating layer.

SUMMARY OF THE INVENTION

It is, therefore, an object of the present invention to provide a nonvolatile semiconductor memory device which ensures stable properties in the insulating layer built between the floating-gate and the control gate and which reduces the load voltage of the insulating layer.

According to the present invention, there is provided a nonvolatile semiconductor memory device comprising: a semiconductor substrate of a first conductivity type; two impurity diffusion regions of a second conductivity type formed in the semiconductor substrate and apart from each other; a floating-gate formed above the semiconductor substrate and between the two impurity diffusion regions, the floating-gate being insulated from the semiconductor substrate, the floating-gate comprising first and second conductive regions having conductivity types opposite to each other; a first control gate formed above the first conductive region of the floating-gate, the first control gate being insulated therefrom; and a second control gate formed above the second conductive region of the floating-gate, the second control gate being insulated therefrom.

BRIEF DESCRIPTION OF THE DRAWINGS

The present invention will be more clearly understood from the following description contrasting the present invention with a conventional device and with reference to the accompanying drawings, wherein.

DETAILED DESCRIPTON OF THE PREFERRED EMBODIMENTS

Figure 1:
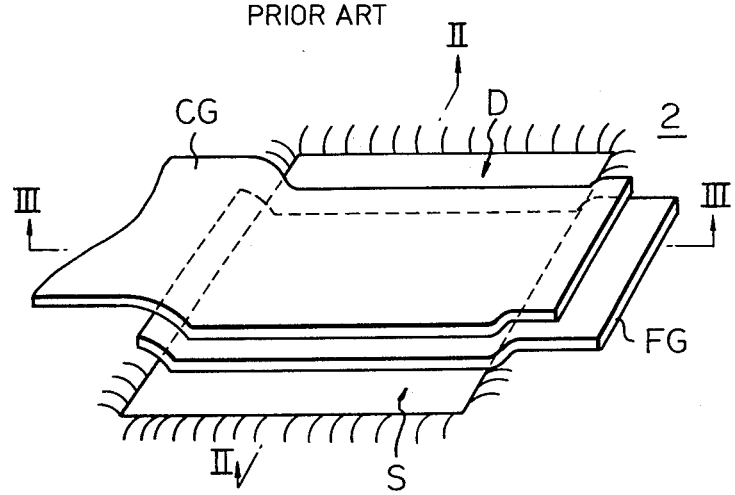
FIG. 1 is a perspective view illustrating one conventional FAMOS device.
Figure 2:
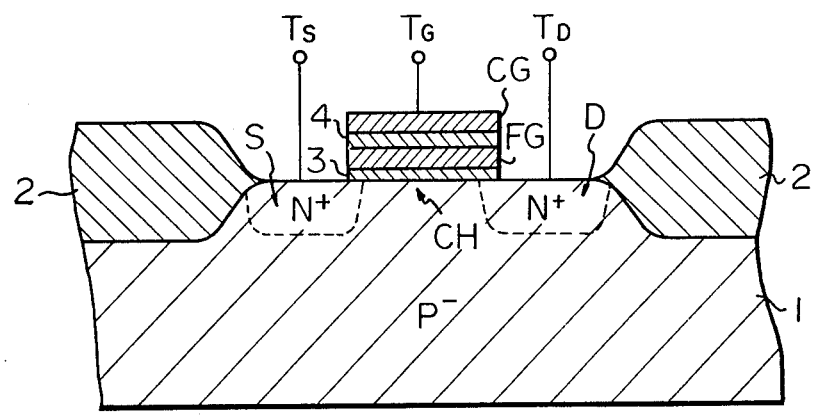
FIGS. 2 and 3 are cross-sectional views taken along the lines II—II and the lines III—III, respectively, of FIG. 1.
Figure 3:
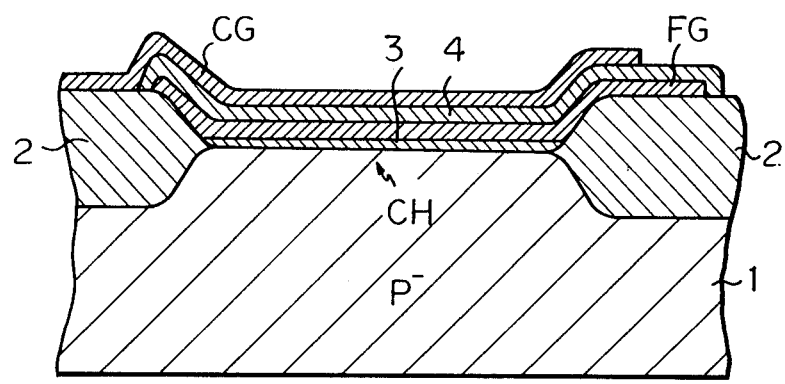

In FIGS. 1, 2, and 3, which illustrate one conventional FAMOS, 1 is a $P^-$-type monocrystalline substrate; 2 is a field insulating layer which is, for example, relatively thick silicon dioxide ($SiO_2$); and 3 and 4 are insulating layers which are, for example, relatively thin silicon dioxide ($SiO_2$). In this case, the field insulating layer 2 defines a field area, while the area in which the field insulating layer 2 is not present defines an active area. In addition, a floating-gate FG of polycrystalline silicon is formed on the active area and is insulated from the substrate 1 by the insulating layer 3. Further, a control gate CG is formed above the floating-gate FG and is insulated therefrom by the insulating layer 4.

In FIGS. 2 and 3, CH is a channel region in the active area under the floating-gate FG. In FIGS. 1 and 2, S and D are a source region and a drain region, respectively, which are formed by $N^+$-type impurity diffusion regions. In addition, in FIG. 2, $T_S$, $T_D$, and $T_G$ are a source electrode, a drain electrode and a gate electrode, respectively.

The write operation of the device as illustrated in FIGS. 1, 2, and 3 will now be explained. The write operation is performed by making use of avalanche breakdown. That is, the potential of the drain electrode $T_D$ is caused to be high, so as to cause the avalanche breakdown in the vicinity of the drain junction. As a result, some of the hot carriers such as hot electrons due to the avalanche breakdown clear an energy barrier built between the substrate 1 and the insulating layer 3 and reach the floating-gate FG. For example, such an energy barrier is about 3 eV between silicon and silicon dioxide. Thus, the floating-gate FG is charged and, accordingly, the write operation is completed.

The erase operation of the device as illustrated in FIGS. 1, 2, and 3 uses the tunnel effect. That is, the potential of the gate drain electrode $T_G$ is caused to be high, and, in addition, the potential of the drain electrode $T_D$ is caused to be low (zero), so as to expel electrons from the floating-gate FG to the control gate CG. In this case, the insulating layer 4 built between the floating-gate FG and the control gate CG must be so thin as to tunnel electrons therethrough. However, it is difficult to manufacture with high accuracy such a thin insulating layer, for example, about 30 Å thick silicon dioxide ($SiO_2$). Therefore, the erase characteristics of this FAMOS device are dependent upon the unstable properties of the insulating layer 4. The insulating layer 4 can be made thick so as to stabilize the layer 4; however, this would necessitate the application of a higher voltage to the control gate CG, which invites electrostatic destruction of the insulating layer 4.

Figure 4:
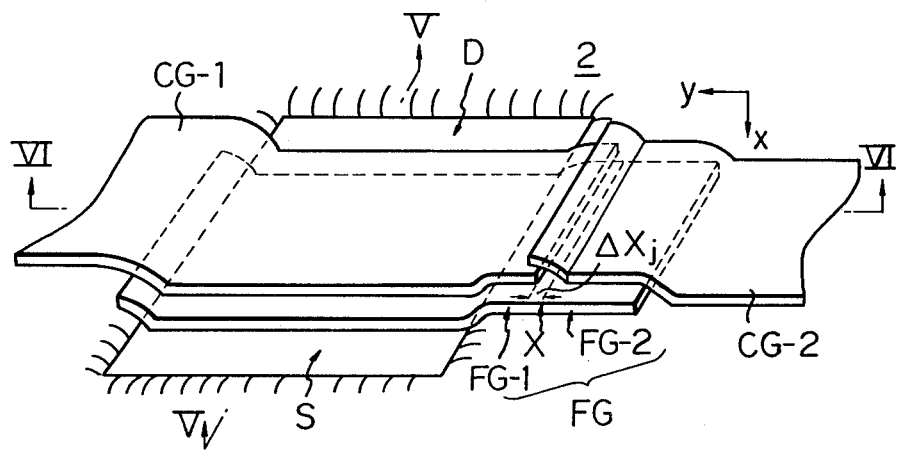
FIG. 4 is a perspective view illustrating an embodiment of the FAMOS device according to the present invention.
Figure 5:
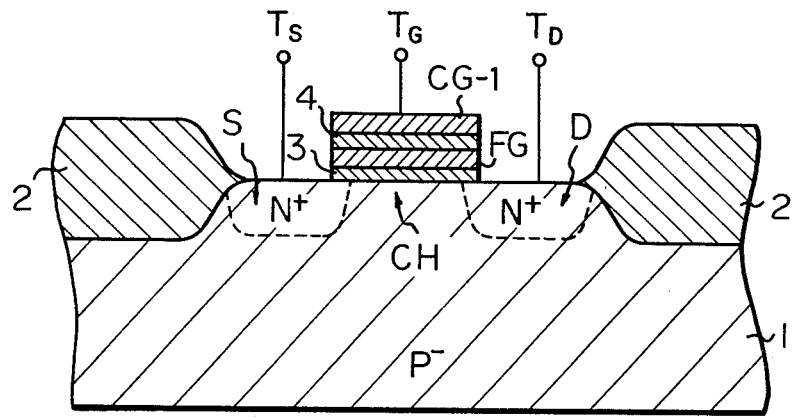
FIGS. 5 and 6 are cross-sectional views taken along the lines V—V and the lines VI—VI, respectively, of FIG. 4.
Figure 6:
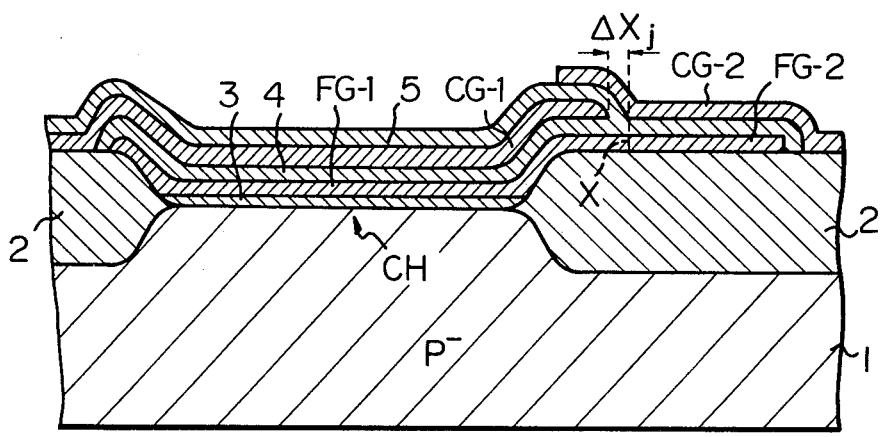

FIG. 4 is a perspective view illustrating an embodiment of the FAMOS device according to the present invention, and FIGS. 5 and 6 are cross-sectional views taken along the lines V—V and the lines VI—VI, respectively, of FIG. 4. In FIGS. 4, 5, and 6, the elements which are the same as those of FIGS. 1, 2, and 3 are denoted by the same references.

As illustrated in FIGS. 4, 5, and 6, the floating-gate FG is divided into two regions: an N-type conductive region FG-1 and a P+-type conductive region FG-2. Accordingly, a P+N junction is formed at the boundary between the regions FG-1 and FG-2. In addition to a control gate CG-1 which corresponds to the control gate CG of the device of FIG. 1, another control gate CG-2 is provided. The control gate CG-1 is placed above the N-type conductive region FG-1 of the floating-gate FG, while the control gate CG-2 is placed above the P+-type conductive region FG-2 of the floating-gate FG.

As illustrated in FIGS. 4 and 6, the control gate CG-2 is placed above the part of the control gate CG-1. In addition, the edge of the control gate CG-1 is placed at the distance $\Delta X_j$ shifted from the boundary between the regions FG-1 and FG-2 toward the side of the region FG-1.

As illustrated in the FIG. 6, a difference in potential between the control gates CG-1 and CG-2 can induce a strong electric field within the distance $\Delta X_j$ due to the capacitive coupling between the two control gates CG-1 and CG-2, which perform the erase operation.

The write and erase operation of the device as illustrated in FIGS. 4, 5, and 6 will be explained below.

Figure 7A:
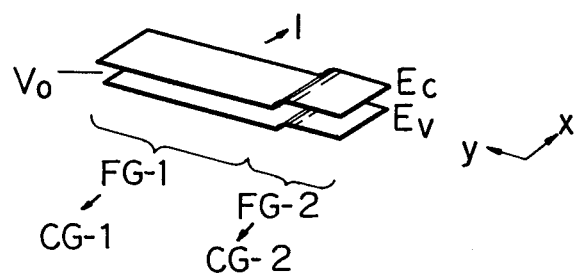
FIGS. 7A, 7B and 7C are energy band diagrams of the floating-gate FG of FIG. 4 for explaining the write operation of the device of FIG. 4.
Figure 7B:
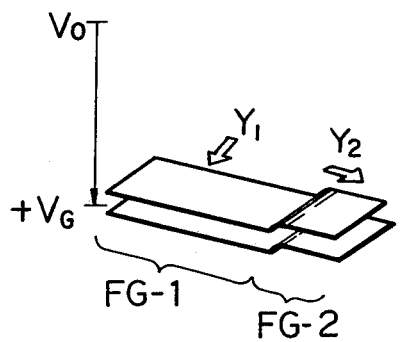
Figure 7C:
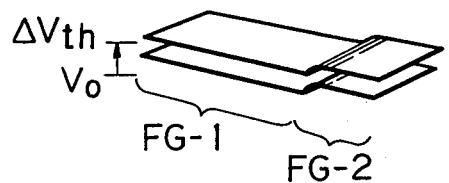

FIGS. 7A, 7B, and 7C are energy band diagrams of the floating-gate FG of FIG. 4 for explaining the write operation of the device of FIG. 4. In these figures, the upper plane indicates the conduction band $E_C$, while the lower plane indicates the valence band $E_V$. In addition, the control gates CG-1 and CG-2 are considered to be located on the front side and the substrate 1 to be located on theback side. In FIG. 7A, which shows the equilibrium state in which no carriers are injected into the floating-gate FG, the Fermi-levels of the regions FG-1 and FG-2 are consistent with the Fermi-level of the control gates CG-1 and CG-2, which is zero ($V_O$).

Next, as illustrated in FIG. 7B, the application of a positive bias voltage $V_G$ is applied to both of the control gates CG-1 and CG-2 and avalanche breakdown is caused in the vicinity of the drain junction near the channel region CH as in the admitted art above. As a result, hot electrons due to the avalanche breakdown are injected into the N-type conductive region FG-1 of the floating-gate FG, as indicated by an arrow $Y_1$. Since a high density of electrons is injected into the region FG-1, some of the electrons are diffused into the P+-type conductive region FG-2, as indicated by an arrow $Y_2$. In this case, the flux of electrons entering the P+-type conductive region FG-2 recombine with holes in the region FG-2.

Next, as illustrated in FIG. 7C, when the potentials applied to the control gates CG-1 and CG-2 return to zero, the floating-gate FG has an enhanced concentration of electrons, that is an accumulation of electrons, due to the capacitive coupling between the floating-gate FG and the control gate CG-1. As a result, the Fermi-level of the floating-gate FG is reduced by $\Delta V_{th}$ and, accordingly, a threshold value $V_{th}$ of the device is increased by $\Delta V_{th}$.

Figure 8A:
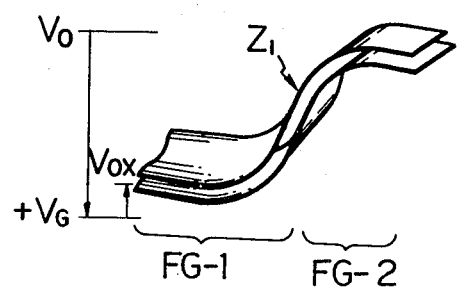
FIGS. 8A, 8B and 8C are energy band diagrams of the floating-gate FG of FIG. 4 for explaining the erase operation of the device of FIG. 4.
Figure 8B:
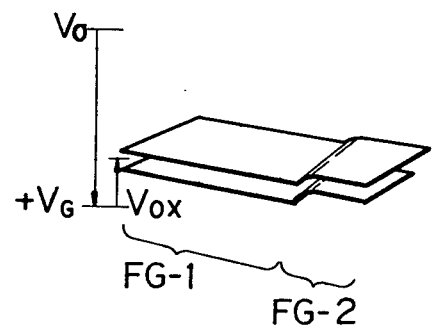
Figure 8C:
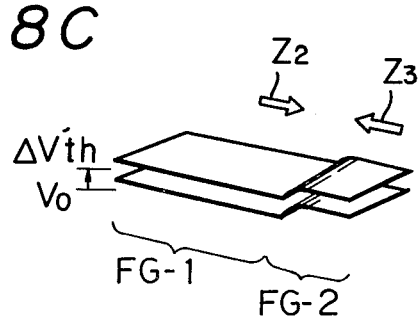

FIGS. 8A, 8B, and 8C are energy band diagrams of the floating-gate FG of FIG. 4 for explaining the erase operation of the device of FIG. 4. As illustrated in FIG. 8A, the application of a positive bias voltage $V_G$ to only the control gate CG-1 with the control gate CG-2 grounded causes a strong electric field in the P+N junction of the regions FG-1 and FG-2, as indicated by an arrow $Z_1$, since the distance $\Delta X_j$ is very small. Since the N-type conductive region FG-1 is insulated from the control gate CG-1 and the substrate 1, electrons injected due to the avalanche breakdown and electrons generated from the increased depletion region of the floating-gate FG are accumulated in the region FG-1 due to the capacitive coupling between the control gate CG-1 and the N-type conductive region FG-1. Therefore, due to the presence of such a strong electric field, avalanche breakdown takes place within the floating-gate FG. As a result, hot electrons and hot holes are injected into the respective regions FG-1 and FG-2 and, in addition, some of such electrons are expelled through the insulating layer 4 to the control gate CG-1 to which a positive bias voltage is applied. The insulation film 4 can have a thickness for instance in the range of 500 to 1200 Å.

FIG. 8B shows the state in which a definite time has passed during the condition that a positive bias voltage $V_G$ is applied to the control gate CG-1. That is, the N-type conductive region FG-1 is in a state where electrons have accumulated therein on the side of the control gate CG-1 and, in addition, the P+-type conductive region FG-2 is in a state where holes have accumulated therein on the side of the control gate CG-2. This is due to the generation of electron-hole pairs near the P+N junction and in the depletion region within the N-type conductive region FG-1. In this case, the potential (Fermi-level) of the floating-gate is determined by the ratio of the capacitance of the control gate CG-1 to that of the control gate CG-2.

Next, as illustrated in FIG. 8C, when the potential of the control gate CG-1 returns to zero, the carriers such as electrons and holes accumulated in the N-type conductive region FG-1 and the P+-type conductive region FG-2, respectively, are moved, as indicated by arrows $Z_2$ and $Z_3$. The fluxes of such electrons and holes form recombination currents. In FIG. 8C, $\Delta V_{th}'$, which is the potential (Fermi-level) of the floating-gate FG, is smaller than the value $\Delta V_{th}$ in FIG. 7C. Note that the difference between the values $\Delta V_{th}$ and $\Delta V_{th}'$ is due to the fact that some of the electrons are expelled through the insulating layer 4 to the control gate CG-1 as explained above.

Therefore, by applying pulse-trains having the above-mentioned positive bias voltage $V_G$ to the control gate CG-1, the hot electrons due to the avalanche breakdown in the floating-gate FG are efficiently removed to the control gate CG-1, so as to reduce the value $\Delta V_{th}'$. When the value $\Delta V_{th}'$ becomes zero, the erase operation is completed.

Note that an effective electric field generated in the P+N junction as indicated by the arrow $Z_1$ of FIG. 8A is represented by $$(V_G - V_{FB} - V_{OX} - V_{th})/\Delta X_j$$

where
  $V_G$ is the positive bias voltage;
  $V_{FB}$ is the flat-band voltage;
  $V_{OX}$ is approximately the difference in potential between the control gate CG-1 and the region FG-1; and
  $V_{th}$ is the threshold voltage.

Therefore, a decrease of the distance $\Delta X_j$ allows the positive bias voltage $V_G$ applied to the control gate CG-1 to be smaller.

As explained hereinbefore, the nonvolatile semiconductor memory device according to the present invention is advantageous, as compared with the conventional device, in that the properties of the insulating layer built between the floating-gate and the control gate can be stable and, in addition, the load voltage of the insulating layer can be reduced.

We claim:

1. A nonvolatile semiconductor memory device comprising:

a semiconductor substrate of a first conductivity type;

two impurity regions of a second conductivity type formed in said semiconductor substrate spaced apart from each other;

a floating gate of a semiconductor formed above said semiconductor substrate and between said two impurity regions, said floating gate being insulated from said semiconductor substrate and comprising first and second conductive regions having conductivity types opposite to each other and providing a junction therebetween;

a first control gate formed above said first conductive region of said floating gate and insulated therefrom;

a second control gate formed above said second conductive region of said floating gate and insulated from said floating gate and said first control gate;

writing and erasing means for applying write voltages to said first and second control gates and said impurity regions to cause avalanche breakdown in said substrate so that hot carriers reach said first region of said floating gate for writing information, and for applying pulse-trains of an erase voltage to said first control gate while grounding said second control gate to cause avalanche breakdown in said floating gate so that hot carriers cross said junction and reach said first control gate for erasing said information; and said second control gate having a portion which rises up and over an edge of a portion of said first control gate that is over said first conductive region in the vicinity of said junction.

2. The device of claim 1, comprising
said first region extending over said substrate between said two impurity regions, and
said first and second control gates being spaced with respect to each other, with respect to said first and second conductive regions of said floating gate and with respect to the junction between said first and second conductive regions of said floating gate so as to cause avalanche breakdown in said floating gate in the vicinity of said junction as a result of said erase voltage being applied across said first and second control gates.

3. The device of claim 2, said first region of said floating gate being formed at least over an active area of said device between said two impurity regions of said substrate, and said second conductive region of said floating gate being formed over a field area of said device.

4. The device of claim 2, wherein said edge of said first control gate is spaced from said junction toward the side of said first conductive region.

5. The device of claim 2, said junction between said first and second conductive regions of said floating gate occurring over a field area of said device.

6. The device of claim 2, said substrate comprising P-type monocrystalline silicon.

7. The device of claim 2, said first and second control gates comprising polycrystalline silicon.

8. The device of claim 2, said floating gate being insulated from said substrate by a silicon dioxide layer which has thickness in the approximate range of 500 to 1200 Å.

9. The device of claim 2, the conductivity of said first and second conductive regions of said floating gate being N- and P-type, respectively.

10. The device of claim 2, said first control gate being insulated from said first region of said floating gate by an insulating layer having a thickness in the range from 500 to 1200 Å.

11. The device of claim 2, said first control gate being insulated from said first region of said floating gate by an insulating layer having a thickness in the range from 500 to 1200 Å.

12. The device of claim 9, wherein said write voltages include a positive voltage applied to both said first and second control gates and a respective voltage applied to one of said impurity regions for causing said avalanche breakdown in said substrate.

13. The device of claim 12 wherein said erase voltage is a positive voltage.

* * * * *